United States Patent
Andersen et al.

(10) Patent No.: US 7,590,251 B2
(45) Date of Patent: Sep. 15, 2009

(54) CLIP DETECTION IN PWM AMPLIFIER

(75) Inventors: Jack B. Andersen, Austin, TX (US);
Larry E. Hand, Meridian, MS (US);
Wilson E. Taylor, Austin, TX (US)

(73) Assignee: D2Audio Corporation, Milpitas, CA (US)

( * ) Notice: Subject to any disclaimer, the term of this patent is extended or adjusted under 35 U.S.C. 154(b) by 645 days.

(21) Appl. No.: 10/805,588

(22) Filed: Mar. 19, 2004

(65) Prior Publication Data

US 2004/0184621 A1 Sep. 23, 2004

Related U.S. Application Data

(60) Provisional application No. 60/469,770, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*H03G 7/00* (2006.01)
*H04B 15/00* (2006.01)
*G06F 17/00* (2006.01)

(52) U.S. Cl. .................. 381/106; 381/94.8; 700/94

(58) Field of Classification Search .............. 381/106, 381/94.8, 94.9, 94.1–3, 94.5, 73.1, 56; 341/126, 341/143; 375/245; 700/94; 704/224–225
See application file for complete search history.

(56) References Cited

U.S. PATENT DOCUMENTS 5,050,172 A 9/1991 Elms et al.

(Continued)

FOREIGN PATENT DOCUMENTS

EP 1128549 A 8/2001

(Continued)

OTHER PUBLICATIONS

Dunn, C. et al.; Use of Clipping in Sigma-Delta Modulators; IEEE Colloquium on Oversampling Techniques and Sigma-Delta Modulation; Mar. 30, 1994; pp. 8/1-8/9.

(Continued)

*Primary Examiner*—Vivian Chin
*Assistant Examiner*—Douglas J Suthers
(74) *Attorney, Agent, or Firm*—Fliesler Meyer LLP

(57) ABSTRACT

Systems and methods for detecting clipping conditions in an audio signal and processing the signal to reduce the clipping conditions. In one embodiment, a system comprises a noise shaper, a modulator, an output stage and other components. A detector detects clipping in the noise shaper and a signal processor processes the audio signal input to the noise shaper based on feedback received from the detector. The signal processor may function to modify the input audio signal in different ways in response to different conditions that are detected by the detector. A filter may be included to filter the output of the detector before being provided to the signal processor. A flag circuit may be coupled between the filter and the signal processor to assert an output signal until the signal processor resets the flag circuit.

29 Claims, 7 Drawing Sheets

U.S. PATENT DOCUMENTS

| | | | |
|---|---|---|---|
| 5,528,695 A * | 6/1996 | Klippel | 381/55 |
| 5,649,054 A | 7/1997 | Oomen et al. | |
| 6,038,516 A | 3/2000 | Alexander et al. | |
| 6,157,331 A | 12/2000 | Liu et al. | |
| 6,498,531 B1 * | 12/2002 | Ulrick et al. | 330/10 |
| 6,816,017 B2 | 11/2004 | Yamashita et al. | |
| 6,972,705 B1 | 12/2005 | Fei et al. | |
| 7,286,010 B2 | 10/2007 | Chieng et al. | |
| 2002/0085725 A1 | 7/2002 | Bizjak | |
| 2002/0167354 A1 | 11/2002 | Stanley | |
| 2004/0017854 A1 | 1/2004 | Hansen et al. | |
| 2004/0222846 A1 | 11/2004 | Melanson et al. | |

FOREIGN PATENT DOCUMENTS

| | | |
|---|---|---|
| JP | 03-265309 | 11/1991 |
| WO | WO-01/26222 | 4/2001 |

OTHER PUBLICATIONS

Meier, W. et al.; Software Amplitude Limitation in Digital Signal Processing Applications; Motorola Technical Developments; Motorola, Inc., Schaumburg, IL, US; vol. 25; Jul. 1, 1995.

Sozanski et al., "Digital control circuit for class-D audio power amplifier," Power Electronics Specialists Conference, 2001. PESC. 2001 IEEE 32nd Annual, vol. 2 (2001), pp. 1245-1250.

English Language translation of Office Action dated Jan. 13, 2009, for Japanese Patent Application No. 2006-507396.

English Language translation of Office Action dated Dec. 13, 2008, for Chinese Patent Application No. 200480009689.9.

\* cited by examiner

CLIP DETECTION IN PWM AMPLIFIER

RELATED APPLICATIONS

This application claims priority to U.S. Provisional Patent Application No. 60/469,770, entitled "Clip Detection in PWM Amplifier", by Andersen, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND OF THE INVENTION

Pulse Width Modulation (PWM) or Class D signal amplification technology has existed for a number of years, but has become more popular with the proliferation of Switched Mode Power Supplies (SMPS). Since this technology emerged, there has been an increased interest in applying PWM techniques in signal amplification applications. This is, at least in part, a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, do little to offset the major barriers to integration of PWM modulators into total amplifier solutions. Class D technology has therefore continued to be unable to displace legacy Class AB amplifiers in mainstream applications.

One of the problems that exists in current PWM amplifier systems is that the processing of audio signals cannot be easily controlled to achieve optimal performance. This problem can be illustrated using the diagram of FIG. 1. FIG. 1 is a block diagram illustrating some of the basic components of a prior art digital PWM amplification channel. As depicted in the figure, the components of amplification channel 100 comprise a noise shaper 110, a modulator 120 and an output stage 130.

High precision PCM Audio data (typically 16 or more bits wide) is input to noise shaper 110, where it is quantized. Typically, the data is quantized to the order of 5-10 bits. The quantized output of noise shaper 110 is then input to modulator 120, which translates the PCM data to pulse-width-modulated (PWM) data. Typically, the data produced by modulator 120 comprises a high-side signal and a low-side signal. These signals are used to drive the high-side and low-side FETs (field effect transistors) of output stage 130, which produces an amplified PWM signal. The signals provided to output stage 130 are typically low pass filtered to remove high frequency noise.

Referring to FIG. 2, a functional block diagram illustrating the structure of a noise shaper in accordance with the prior art is shown. It can be seen from the figure that noise shaper 110 consists of a quantizer 210 and a filter 220. An input data stream consisting of PCM audio data combined with filter data produced by filter 220. The transfer function of filter 220 is designed to filter the difference between the input data stream and the output data stream in order to attenuate the noise created by quantizer 210 in the audio band and amplify the noise at higher frequencies. Quantizer 210 is designed to process the combined data by mapping the data to a discrete number of output values. Quantizer 210 thereby performs a rounding function (rounding the received PCM data to the nearest quantized value) and a clipping function (mapping received PCM data outside the quantized range to either the maximum or minimum values that can be represented)

When the input to quantizer 210 exceeds the quantized range of values, the quantizer clips the data. The resulting output of quantizer 210 is similar to clipping in an ordinary analog amplifier, in which the peaks are removed from the signal. This distorts the audio signal represented by the data and produces audio artifacts that can be audible. The clipping of the signal received by quantizer 210 also results in quantization error. Quantization error is the difference between the input to quantizer 210 and the output from quantizer 210. The quantization error increases when quantizer 210 clips the signal. The quantization error can produce instability in the noise shaper, as well as other undesirable audible effects.

Conventionally, the problems caused by clipping of the signal in the noise shaper are addressed by using a clipping circuit separate from the quantizer to clip the input signal before it is input to the noise shaper. This clipping circuit is configured to clip the signal at levels which are lower than the levels at which the quantizer in the noise shaper clips. While this does relieve the problem of quantization error that would otherwise occur as a result of clipping by the quantizer, it does not eliminate the distortion of the signal from clipping, and may even aggravate the problem, since the clipping circuit clips the signal at lower levels than the quantizer. Put another way, the use of the clipping circuit has the undesirable effect of limiting the maximum range of the output (the modulation index) more than is strictly necessary.

SUMMARY OF THE INVENTION

One or more of the problems outlined above may be solved by the various embodiments of the invention. Broadly speaking, the invention comprises systems and methods for detecting clipping conditions in an audio signal and processing the signal to reduce the clipping conditions.

One embodiment of the invention comprises a system for reducing some of the problems of prior art systems, where, instead of clipping the input audio signal at a fixed level, the input audio signal is processed in a variable manner. For instance, at some times, the input audio signal may be clipped, at other times the input audio signal may be compressed, and at still other times the input audio signal may not be modified at all.

One embodiment comprises a system including a detector configured to detect a clipping condition in an audio signal and a signal processor coupled to receive a feedback signal from the detector, where the signal processor is configured to modify the audio signal in response to the feedback signal received from the detector. In one embodiment, the system includes a noise shaper, a modulator, an output stage and several additional components. These components include a detector for detecting clipping in the noise shaper and a signal processor for processing the audio signal input to the noise shaper based on feedback received from the detector. The signal processor may function to modify the input audio signal in different ways in response to different conditions that are detected by the detector.

In one embodiment, the system also includes a filter for filtering the output of the detector before this information is provided to the signal processor as feedback. The filtering of the feedback may serve to prevent the signal processor from modifying the audio signal if the clipping of the audio signal occurs only occasionally, while allowing the signal processor to modify the audio signal if the clipping of the audio signal occurs more frequently. In one embodiment, the system also includes a flag circuit coupled between the filter and the signal processor. The flag circuit is configured to receive the filtered feedback signal from the filter and to assert an output signal that is provided to the signal processor when the filtered feedback signal is asserted. The output signal produced by the flag circuit remains asserted until the signal processor resets the flag circuit. This provides an even more stable feedback signal to the signal processor than simply filtering the signal.

One alternative embodiment comprises a method including the steps of detecting a clipping condition in an audio signal and modifying the audio signal in response to detecting the clipping condition. As with the embodiments noted above, both the clipping conditions and the response to the detection of the clipping condition may vary from one embodiment to another. In one embodiment, the method may be implemented in a sample rate converter for a digital audio amplifier.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
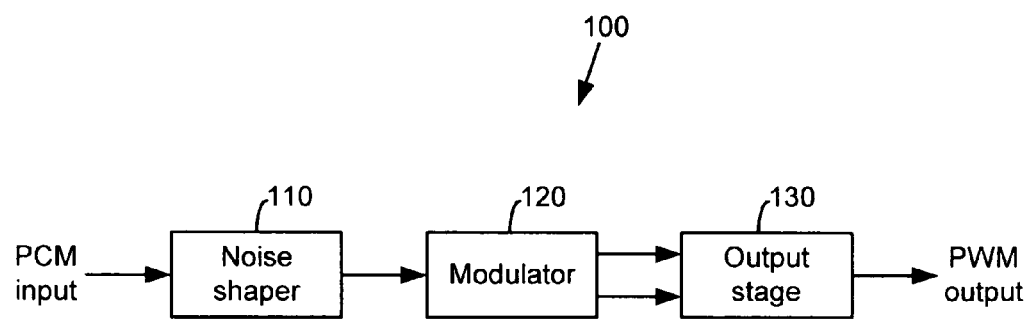
FIG. 1 is a block diagram illustrating some of the basic components of a prior art digital PWM amplification channel.
Figure 2:
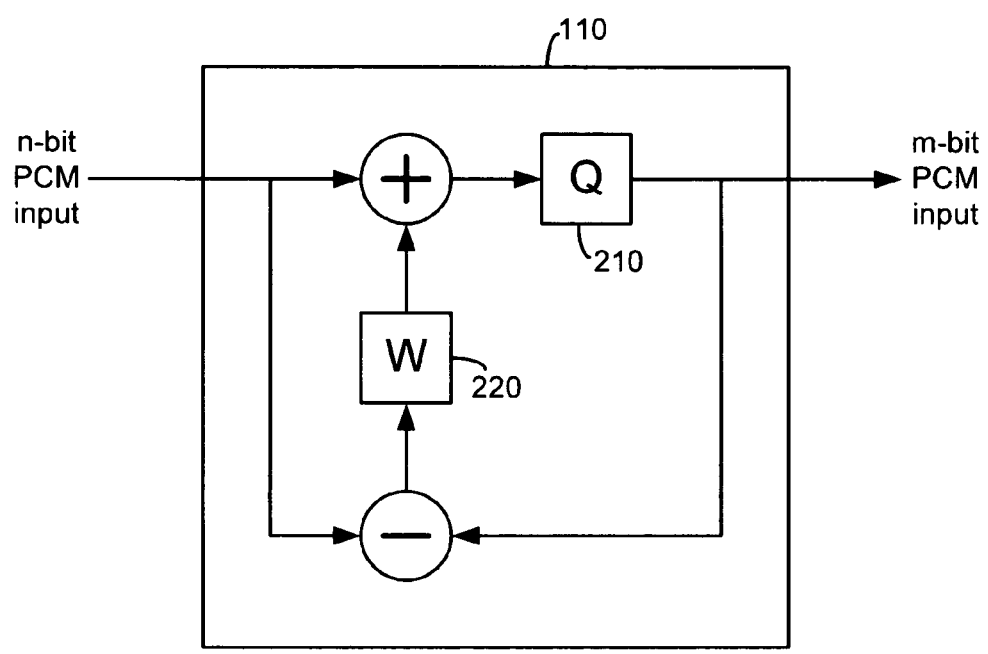
FIG. 2 is a functional block diagram illustrating the structure of a noise shaper in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for detecting clipping conditions in an audio signal and processing the signal to reduce the clipping conditions.

One embodiment of the invention comprises a system for reducing some of the problems of prior art systems, where, instead of clipping the input audio signal at a fixed level, the input audio signal is processed in a variable manner. For instance, at some times, the input audio signal may be clipped, at other times the input audio signal may be compressed, and at still other times the input audio signal may not be modified at all. In one embodiment, the system includes a noise shaper, a modulator, an output stage and several additional components. These components include a detector for detecting clipping in the noise shaper and a signal processor for processing the audio signal input to the noise shaper based on feedback received from the detector. The signal processor may function to modify the input audio signal in different ways in response to different conditions that are detected by the detector.

In one embodiment, the system also includes a filter for filtering the output of the detector before this information is provided to the signal processor as feedback. The filtering of the feedback may serve to prevent the signal processor from modifying the audio signal if the clipping of the audio signal occurs only occasionally, while allowing the signal processor to modify the audio signal if the clipping of the audio signal occurs more frequently. In one embodiment, the system also includes a flag circuit coupled between the filter and the signal processor. The flag circuit is configured to receive the filtered feedback signal from the filter and to assert an output signal that is provided to the signal processor when the filtered feedback signal is asserted. The output signal produced by the flag circuit remains asserted until the signal processor resets the flag circuit. This provides an even more stable feedback signal to the signal processor than simply filtering the signal.

Various alternative embodiments will be described below, and still other embodiments will be apparent to persons of ordinary skill in the art of the invention.

Figure 3:
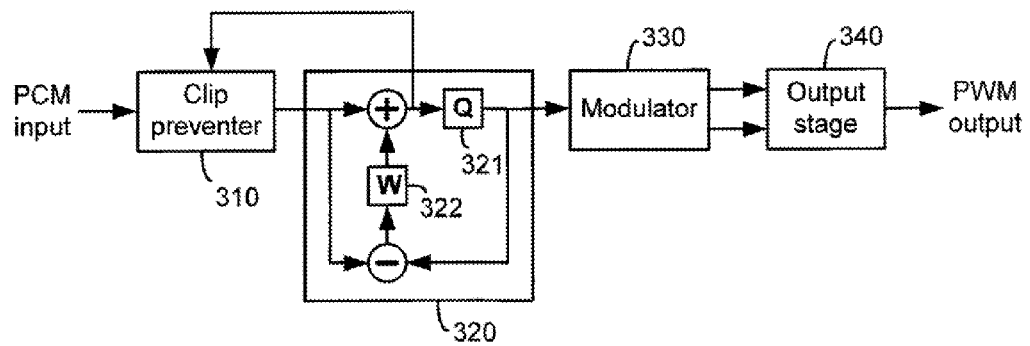
FIG. 3 is a functional block diagram illustrating a portion of a digital audio amplification channel in accordance with one embodiment.

Referring to FIG. 3, a functional block diagram illustrating a portion of a digital audio amplification channel in accordance with one embodiment is shown. In this embodiment, a PCM digital audio signal is input to clip prevention unit 310. Clip prevention unit 310 may or may not process the input audio signal, depending upon the feedback is derived from noise shaper 320. After the audio signal is quantized by noise shaper 320, it is provided to modulator 330, which converts it to a pair of pulse width modulated signals. These signals are then provided to output stage 340, which generates a PWM audio signal.

As shown in FIG. 3, the audio data is provided to the system in the form of a pulse code modulated, or PCM signal. Pulse code modulation is a scheme for encoding analog data. PCM signals are binary. That is, there are only two possible states, represented by logic 1 (high) and logic 0 (low), no matter how complex the analog waveform is. Using a PCM scheme, it is possible to digitize all forms of analog data, including audio data.

To obtain a PCM audio stream from an analog waveform, the amplitude of the analog signal is sampled at regular time intervals. The sampling rate is several times the maximum frequency of the analog waveform. The instantaneous amplitude of the analog signal at each sampling is quantized by rounding it to the nearest of a set of specific, predetermined levels. The number of levels is a power of 2, and the sampled amplitude is represented by a set of binary digits (bits) corresponding to the power to which 2 is raised. For example, if the analog signal is quantized to 64 (2^6) levels, each sample is represented by a set of six bits. If the analog signal is quantized to 1024 (2^10) levels, each sample is represented by a set of ten bits.

The PCM audio is processed by signal processor 310 and passed to noise shaper 320. Noise shaper 320 has a quantizer 321 and a filter 322. The PCM audio data is typically high precision data that is quantized at 16 bits or more. The purpose of quantizer 321 is to quantize the audio data to a lower number of bits. Typically, quantizer 321 produces 5- to 10-bit audio data. The purpose of filter 322 is to shift the noise created by quantizer 321 out of the audio band. In other words, and filter 322 attenuates the noise in the audio band, while amplifying the noise outside the audio band. This is accomplished by taking the difference between the audio signal input to noise shaper 320 and the audio signal output by quantizer 321, filtering the resulting difference signal and adding this to the audio signal before it is input to quantizer 321.

Quantizer 321, in the process of re-quantizing the audio data, both rounds the data and potentially clips the data. The rounding occurs because of the levels at which the input audio data is originally quantized probably do not match the levels at which quantizer 321 re-quantizes the data. The clipping may occur because the input audio data may include values that are outside the range that can be presented on the output of quantizer 321. These values that are outside this range are mapped to either the maximum or minimum values that can be represented the quantizer output.

When the input audio signal exceeds the range of quantizer 321, quantizer 321 clips the signal. In other words, the peaks are removed from the signal. This clipping is similar to the clipping that occurs in an ordinary analog amplifier. The removal of the peaks from the signal distorts the signal and, if the distortion of the signal is substantial enough, it can be audible. As noted above, the clipping of the signal also results in increased quantization error (the difference between the input to quantizer 321 and the output of the quantizer). If the quantization error is great enough, the noise shaper can become unstable.

The operation of quantizer 321 can therefore be described algorithmically in the following manner:

```
if (in > max)
    out = max
else if (in < min)
    out = min
else
    out = delta*round(in/delta)
```

As used here, "in" is the input audio signal, "out" is the output audio signal, "max" is the maximum output level of the signal produced by quantizer 321, "min" is the minimum output level of the quantizer signal, "delta" is the step size of the quantization and "round" is a function that returns its input rounded to the nearest integer value. "Max" and "min" are multiples of "delta". After quantization, "out" can assume any of (max-min)/delta+1 possible values in the range [min; max]. The maximum values that define the range of quantizer 321 (the values of "min" and "max") determine the minimum and maximum pulse widths that will be generated by modulator 330. Normally, these values are set to match the minimum and maximum pulse widths that can be handled by a driver and the FETs in output stage 340 in a given implementation.

The signal generated by quantizer 321 is output by noise shaper 320 and provided to modulator 330. The modulator 330 translates the re-quantized PCM data to pulse width modulated (PWM) data. In other words, each set of bits corresponding to an audio data sample in the PCM data stream is converted to a pulse having a width proportional to the sample. In the case of modulator 330, two output signals are produced. These signals are identical, except that they are inverted with respect to each other. In this embodiment, output stage 340 includes two field effect transistors (FETs). Each of the signals produced by modulator 330 is used to drive one of the FETs in output stage 340. In one embodiment, each of the output signals produced by modulator 330 is low pass filtered to remove high frequency noise.

It will be appreciated by one skilled in the art, that this is a highly simplified description. Typically, interpolation and correction is performed on the PCM data to correct for non-linearities in the pulse width modulation processing before the data is input to the noise shaper. Further, the output of the noise shaper is typically processed to provide support for output stage protection and edge placement. The output stage may have any of a number of different configurations, such as a half bridge N+N FET configuration. Alternative configurations may use N or P FETs, full bridge configurations, etc. Other noise shaper configurations are also possible. Many such variations will be apparent to persons skilled in the art of the invention upon reading the present disclosure.

In one embodiment, noise shaper 320, modulator 330 and output stage 340 are the same as the corresponding components of prior art system 100, described above in relation to FIG. 1. Thus, noise shaper 320 receives the PCM audio signal, which may be a 16-bit signal, and quantizes the signal to a smaller number of bits.

The system illustrated in FIG. 3 differs from the system of FIG. 1 in the use of clip prevention unit 310. Clip prevention unit 310 does not simply clip the input audio signal at a fixed level, but instead processes the input audio signal to clip or otherwise modify the audio signal as needed to alleviate the problems described above in connection with FIG. 1. In other words, the manner in which clip prevention unit 310 operates is dependent upon the audio signal itself. If the input audio signal has a relatively low modulation index and therefore does not contain any peaks that exceed the range of signals that can be quantized by noise shaper 320, clip prevention unit 310 may not modify the input audio signal at all before providing the signal to noise shaper 320. If, the other hand, the input audio signal has a relatively high modulation index and has peaks that will be clipped by quantizer 321 of noise shaper 320, clip prevention unit 310 may significantly modify the audio signal before providing the modified signal to noise shaper 320. If the input audio signal has a moderate modulation index, clip prevention unit 310 may function to occasionally modify portions of the audio signal, while leaving others unmodified.

Figure 4:
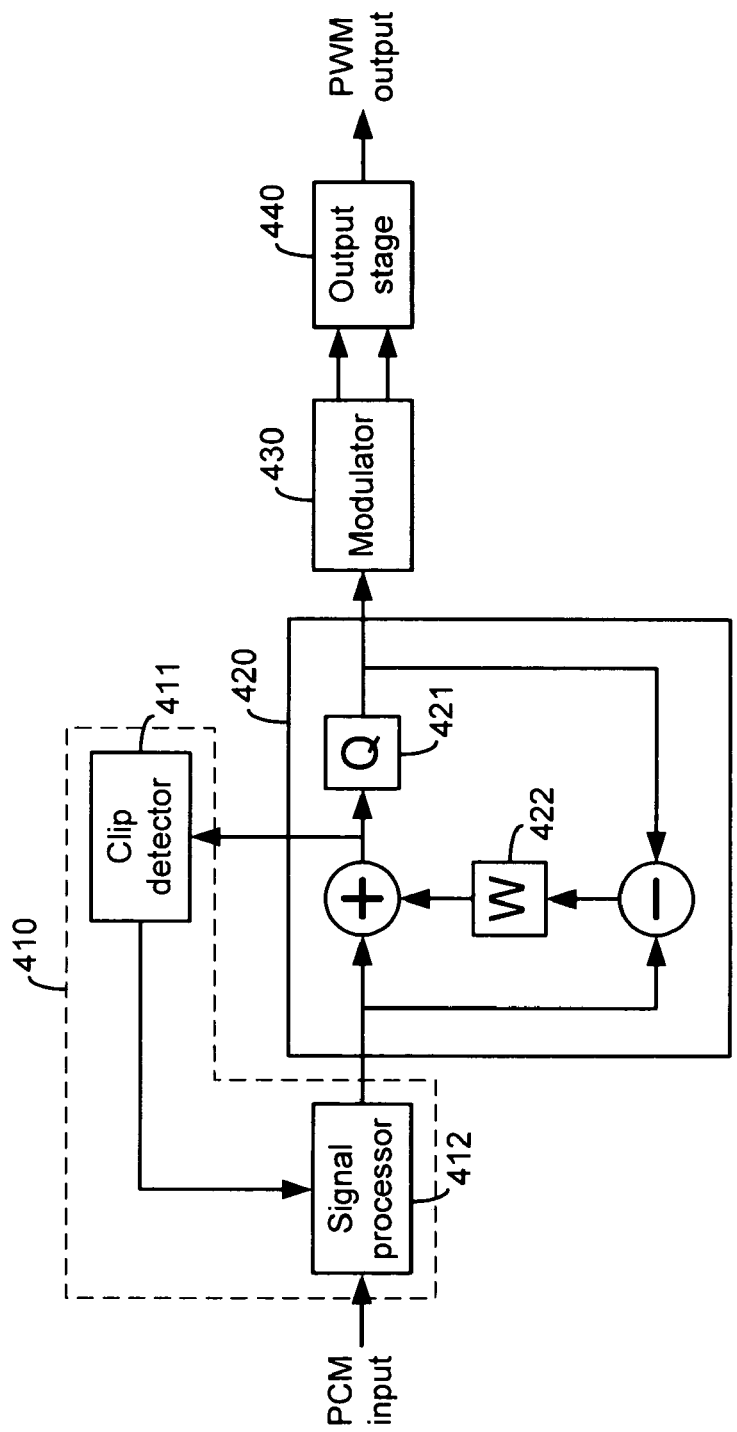
FIG. 4 is a functional block diagram illustrating the use of a clip detector and a signal processor in accordance with one embodiment.

Referring to FIG. 4, a functional block diagram illustrating the use of a clip detector and a signal processor in accordance with one embodiment is shown. In this embodiment, clip prevention unit 410 comprises a clip detector 411 and a signal processor 412. A PCM audio signal is input to signal processor 412, which processes the signal in accordance with the feedback received from clip detector 411 and then forwards the processed signal to noise shaper 420. Noise shaper 420 quantizes the signal and forwards it to modulator 430, which provides a pair of signals to drive output stage 440.

In this embodiment, clip detector 411 receives the same signal that is input to quantizer 421 of noise shaper 420. Clip detector 411 processes this input signal in parallel with quantizer 421 to detect conditions that indicate that signal processor 411 should modify the input PCM audio data. In one embodiment, this condition may simply be that the audio signal exceeds the range that quantizer 421 can re-quantize without clipping the signal. In other words, clip detector 411 detects clipping in quantizer 421. The operation of clip detector 411 can be described in algorithmic form in the following manner:

```
if (in > maxclip)
    clip = true
else if (in < minclip)
    clip = true
else
    clip = false
```

As used here, "in" is the input to the quantizer, "maxclip" and "minclip" are the threshold levels at which clipping begins to occur, and the signal "clip" which is output by clip detector 411 is set to "true" when the input ("in") is outside the allowed range [minclip;maxclip] and "false" otherwise.

In general "maxclip" and "minclip" can be set arbitrarily. In a preferred embodiment, minclip is set to the minimum clipping threshold of the quantizer ("min," as used in the algorithmic description of the quantizer set forth above) and maxclip is set to the maximum clipping threshold of the quantizer ("max," as used in the algorithmic description of the quantizer). This allows an efficient implementation where the quantizer and clip detection are combined:

```
if (in > max)
    out = max
    clip = true
else if (in < min)
    out = min
    clip = true
else
    out = delta*round(in/delta)
    clip = false
```

It should be noted that, while the embodiment described by the above algorithm asserts an output signal based upon the simple clipping of the signal input to the quantizer (i.e., the output signal is asserted whenever there is any occurrence of clipping), alternative embodiments may implement more complex detection schemes. For example, they may assert an output signal upon detecting particular sets of conditions, or upon detecting types of clipping that might lead to instability in the quantizer. Any such clipping conditions may be detected by clip detector 411 and serve as the basis for assertion of the corresponding output signal generated by clip detector 411.

The output signal ("clip") generated by clip detector 411 is provided as feedback to signal processor 412 which is positioned in front of noise shaper 420. The purpose of signal processor 412 is to limit the range of the audio signal that is input to noise shaper 420, but to do so in a more "intelligent" fashion than simply clipping the signal at a fixed level. In one embodiment, signal processor 412 is configured to act as a compressor-limiter. In this embodiment, signal processor 412 is configured to compress at least a portion of the audio signal in order to avoid or minimize the clipping that would otherwise occur in noise shaper 420. This may, in many instances, be easy to implement because the amplifier in which the invention is implemented may already have a compressor-limiter circuit that can be used by signal processor 412 to achieve this function.

Figure 5:
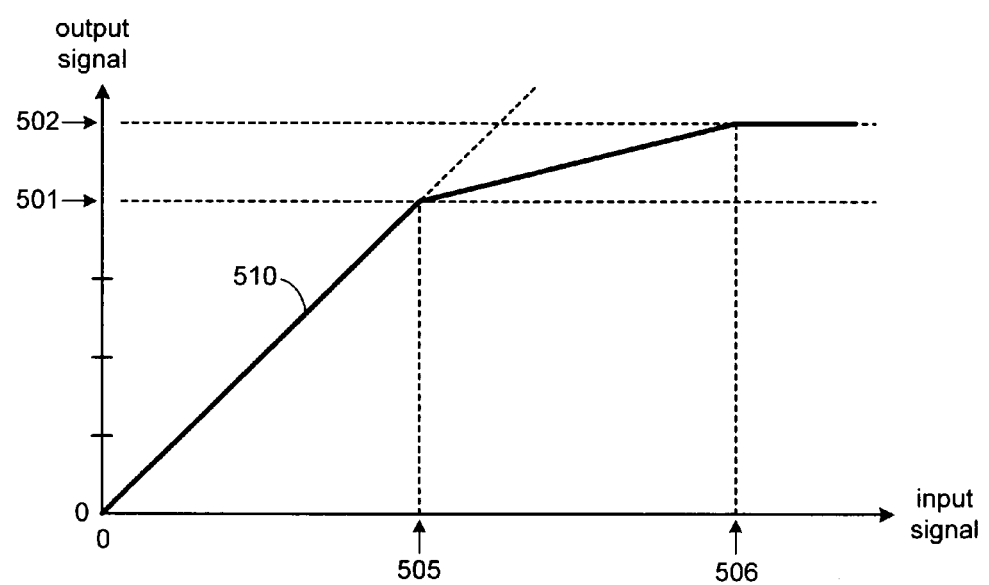
FIG. 5 is a diagram illustrating the response of a signal processor to an input audio signal in accordance with one embodiment.

The compressor-limiter function that can be performed by signal processor 412 is illustrated in FIG. 5. FIG. 5 is a diagram illustrating the response of signal processor 412 to an input audio signal. The response of signal processor 412 is shown by curve 510. Response curve 510 can be viewed as having three segments. The first segment is the response to an input that is in the range from 0 to a first threshold 505 (corresponding to an output level 501). Input audio levels in this range are linearly output at a 1:1 ratio. In other words, the output equals the input. If the input is in the range from the first threshold 505 to a second threshold 506, the output is compressed. Put another way, the output level is less than the input level, but is not clipped. The output level is reduced from the 1:1 output that is indicated in the figure by a dotted line extending upward from the first segment of response curve 510. Finally, input levels above the second threshold 506 are clipped at a maximum output level 502.

It should be noted that the compressor-limiter function illustrated in FIG. 5 is only one possible variation of the response of signal processor 412. The response can alternatively be as simple as a clipping function, or can be more complex, having additional response segments, smooth response curves, or other variations. The response function also changes in response to the feedback received from clip detector 411 (or clip filters or clip flag circuits, as will be described in detail below).

It should be noted that signal processor 412 can be placed before, between or after various other functional blocks of the amplifier channel, such as the interpolation and PWM linearity correction blocks mentioned above. Signal processor 412 can also be implemented in various ways. For instance, signal processor 412 can be implemented in hardware using logic gates. Alternatively, and possibly a more simple and flexible solution, is to implement signal processor 412 in software running on a programmable digital signal processor (DSP), which would typically already be present in a digital amplifier.

Figure 6:
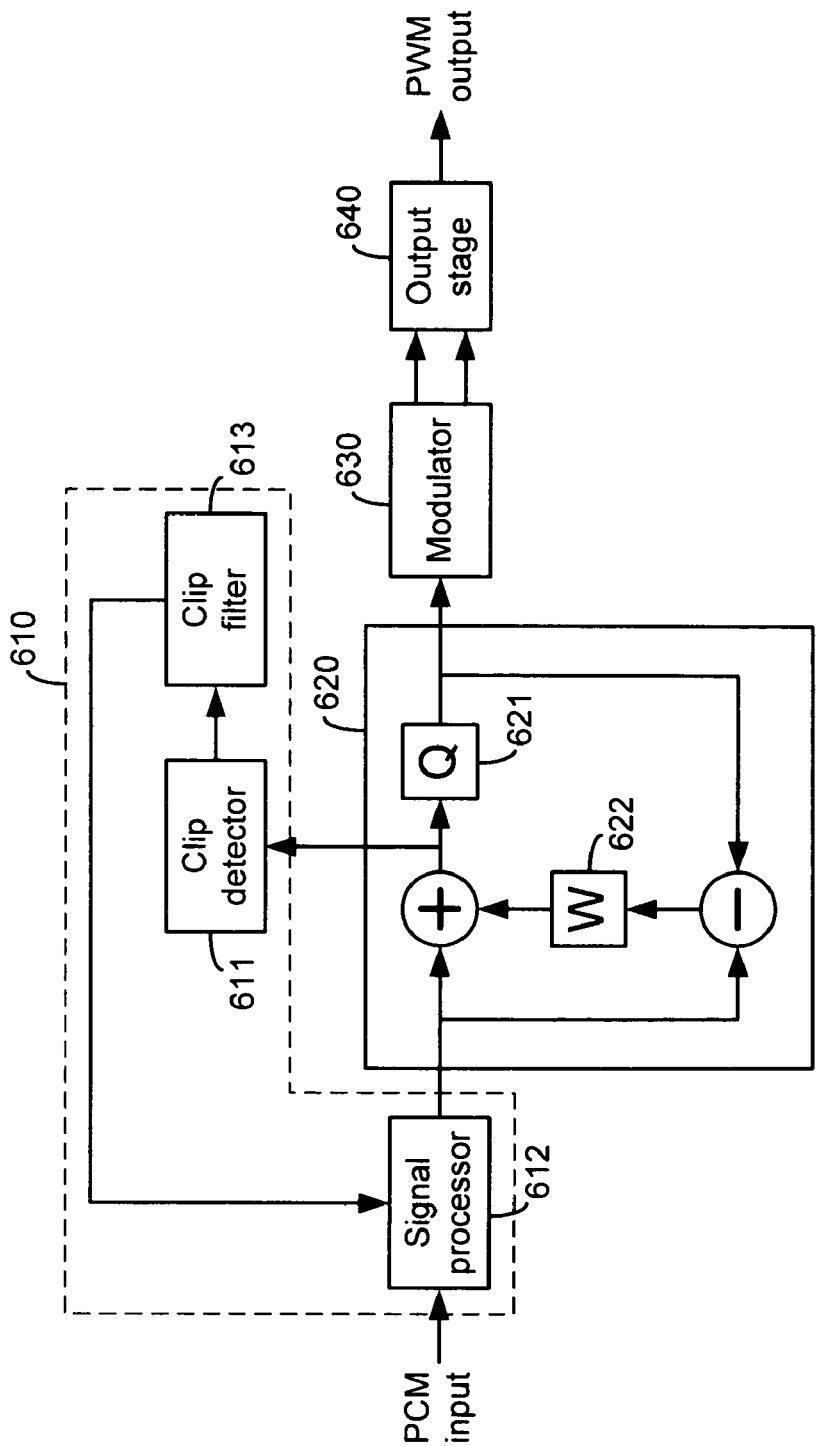
FIG. 6 is a functional block diagram illustrating the use of a clip detector, filter and signal processor in accordance with an alternative embodiment.

Referring to FIG. 6, a functional block diagram illustrating the use of a clip detector, filter and signal processor in accordance with an alternative embodiment is shown. In this embodiment, clip prevention unit 610 comprises a clip detector 611, a clip filter 613 and a signal processor 612. Again, a PCM audio signal is input to signal processor 612, which processes the signal in accordance with received feedback. In this embodiment, however, the feedback is received from clip detector 611 via filter 613. Signal processor 612 forwards the processed signal to noise shaper 620, which quantizes the signal and forwards it to modulator 630. Modulator 630 then provides a pair of signals to drive output stage 640.

In this embodiment, clip detector 611 receives the signal that is input to quantizer 621 of noise shaper 620 and processes this signal in parallel with quantizer 621. Clip detector 621 detects clip conditions indicating that signal processor 611 should modify the input PCM audio data and generates a corresponding signal. This signal is provided to clip filter 613. After being filtered by clip filter 613, the signal is provided as feedback to signal processor 612, which can then modify the input audio signal as indicated by this feedback. The modification of the audio signal by signal processor 612 is, as described above, variable according to the received feedback.

At high input levels, quantizer 621 in noise shaper 620 may clip the audio signal only occasionally. This may be due, for example, to the noise shaping of the signal or due to short, high input spikes. Depending on its design, noise shaper 620 may be able to handle clipping of a few of these spikes without becoming unstable. Consequently, compressing the input in these cases would unnecessarily limit the output signal. Clip filter 613 can therefore be employed to filter out single occurrences or short bursts of "clip detections" and prevent them from triggering the modification of the input audio signal by signal processor 612.

In one embodiment, an adequate implementation of clip filter 613 can be provided using a counter. The counter can be implemented as described in the following algorithmic description:

```
if (clip == true)
    if (clipcnt == clipmax)
        clipcnt   = clipcnt
        clipfiltered = true
    else
        clipcnt   = clipcnt+1
        clipfiltered = false
else
    clipcnt = 0
    clipfiltered = false
```

As used here, "clip" here is the output from clip detector 611. The internal state variable "clipcnt" counts the number of continuous active "clip" inputs. "clipcnt" is initialized to 0 before processing begins. When "clipcnt" reaches the value "clipmax," the counter stops counting and sets the "clipfiltered" output to true. "clipfiltered" remains active until the input "clip" becomes inactive. This will also reset "clipcnt" to 0.

It will be appreciated by one skilled in the art that the clip filter can be implemented in various ways. The various possible implementations can based on hardware, software, or combinations thereof. These implementations can use various different types of algorithms, such as IIR, FIR, majority vote, up/down count, and so on. It should be noted that, when clip filter 613 is implemented in fixed hardware, it may be advantageous to make the limit "clipmax" programmable, so that this value can be adjusted for individual applications of the circuit.

Figure 7:
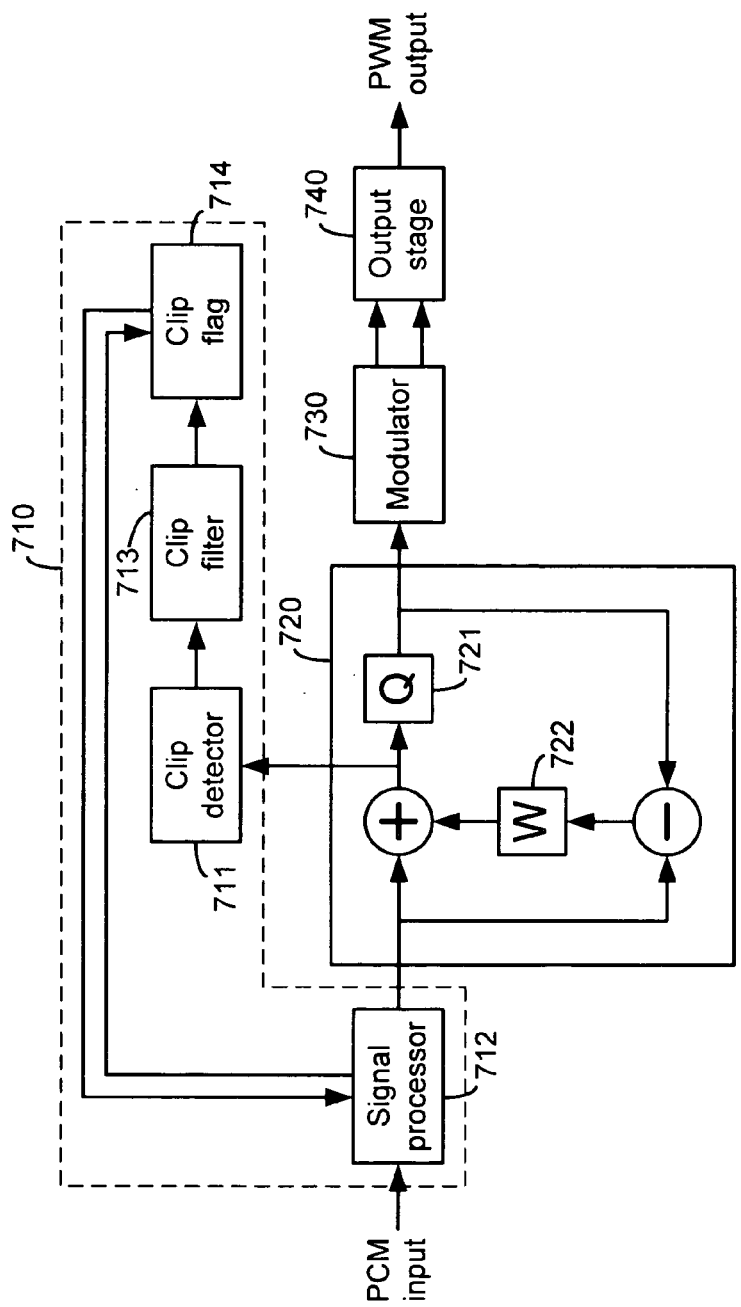
FIG. 7 is a functional block diagram illustrating the use of a clip detector, clip filter, clip flag and signal processor in accordance with another alternative embodiment.

Referring to FIG. 7, a functional block diagram illustrating the use of a clip detector, clip filter, clip flag and signal processor in accordance with another alternative embodiment is shown. In this embodiment, clip prevention unit 710 comprises a clip detector 711, a clip filter 713, a clip flag circuit 714 and a signal processor 712. As in the other embodiments, a PCM audio signal is input to signal processor 712, which processes the signal in accordance with received feedback. In this embodiment, however, the feedback is received from clip detector 711 and filter 713 via clip flag circuit 714. Signal processor 712 forwards the processed signal to noise shaper 720, which quantizes the signal and forwards it to modulator 730. Modulator 730 then provides a pair of signals to drive output stage 740.

In this embodiment, clip detector 711 receives the signal that is input to quantizer 721 of noise shaper 720 and processes this signal in parallel with quantizer 721. Clip detector 721 detects clip conditions and generates a corresponding signal that is provided to clip filter 713. After being filtered by clip filter 713, the signal is provided to clip flag circuit 714. If the filtered signal received from filter 713 is asserted (indicating that the audio signal input to signal processor 712 should be modified), clip flag circuit 714 asserts an output signal and maintains this signal until clip flag circuit 714 is reset by signal processor 712. The output signal generated by clip flag circuit 714 is provided as feedback to signal processor 712. Signal processor 712 can then variably modify the input audio signal as indicated by this feedback.

The use of a clip flag circuit may be advantageous in some embodiments, particularly those based on software. Clip flag circuit 714 may be inserted between clip filter 713 (or clip detector 711) and signal processor 712, or it may be incorporated into one of these components. The purpose of clip flag circuit 714 is to store the information that the input audio signal was clipped either once or long enough to trigger the clip filter. Once signal processor 712 has acted on (in response to) the assertion of flag circuit 714, it activates a "clear" signal to flag circuit 714 to clear the flag. When implemented in software on a digital signal processor, the output of clip flag circuit 714 can be polled or handled using interrupts.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system comprising:
   a noise shaper configured to receive an input audio signal including a plurality of samples and perform a noise shaping process including re-quantizing the input audio signal to produce a processed audio signal and shifting quantization noise in the processed audio signal out of an audio band;
   a detector coupled to the noise shaper and configured to detect clipping of the input audio signal in the noise shaper when a value of a sample of the input audio signal is outside a specified range of values, and not detect clipping when a value of a sample of the input audio signal is within the specified range of values;
   a signal processor configured to receive a feedback signal indicative of whether clipping is detected by the detector;
   wherein the signal processor is configured to modify the input audio signal in response to the feedback signal received from the detector, wherein the modification of the input audio signal is a function of the detected clipping.

2. The system of claim 1, wherein modification of the input audio signal by the signal processor is variable according to the feedback signal received from the detector.

3. The system of claim 1, wherein the system comprises one or more components of a digital audio amplifier.

4. The system of claim 1, wherein the signal processor is configured to modify the input audio signal by in clipping one or more values of samples of the input audio signal prior to re-quantizing of the one or more values of samples of the input audio signal.

5. The system of claim 1, wherein the signal processor is configured to modify the input audio signal by compressing the input audio signal.

6. The system of claim 5, wherein the signal processor is configured to modify the input audio signal by compressing only a portion of the input audio signal that exceeds a threshold amplitude level.

7. The system of claim 1, further comprising a filter coupled between the detector and the signal processor, wherein the filter is configured to filter the feedback signal of the detector.

8. The system of claim 7, wherein the filter comprises a counter that is incremented for each clock cycle in which the output signal of the clip detector is asserted and that is reset on each clock cycle in which the output signal of the clip detector is not asserted.

9. The system of claim 8, wherein the filter is configured to assert the filtered feedback signal when the counter reaches a threshold level.

10. The system of claim 7, further comprising a flag circuit coupled between the filter and the signal processor, wherein the flag circuit is configured to receive the filtered feedback signal and, if the filtered feedback signal is in an asserted state, to maintain the filtered feedback signal in the asserted state until the flag circuit is reset by the signal processor.

11. The system of claim 1, wherein the clipping condition comprises simple clipping of the audio signal.

12. A method for use in a digital audio amplifier, the method comprising:
   receiving an input audio signal in a noise shaper of the digital audio amplifier, the input audio signal including a plurality of samples;
   re-quantizing by a quantizer the input audio signal to produce a processed audio signal;
   shifting quantization noise in the processed audio signal out of an audio band;
   detecting clipping of the input audio signal in the noise shaper when a value of a sample of the input audio signal is outside a specified range of values, and not detecting clipping when a value of a sample of the input audio signal is within the specified range of values; and modifying the input audio signal as a function of the detected clipping in response to detecting the clipping of the input audio signal.

13. The method of claim 12, wherein modifying the input audio signal comprises modifying the input audio signal in a variable manner.

14. The method of claim 12, wherein a processed audio signal output by the noise shaper is amplified in the digital audio amplifier.

15. The method of claim 12, wherein modifying the input audio signal comprises clipping one or more values of samples of the input audio signal prior to re-quantizing of the one or more values of samples of the input audio signal.

16. The method of claim 12, wherein modifying the input audio signal comprises compressing the input audio signal.

17. The method of claim 16, wherein modifying the input audio signal comprises compressing only a portion of the input audio signal that exceeds a threshold amplitude level.

18. The method of claim 12, further comprising filtering a feedback signal corresponding to detected clipping, wherein modifying the input audio signal in response to detecting the clipping comprises modifying the input audio signal in response to the filtered feedback signal.

19. The method of claim 18, wherein filtering the feedback signal comprises incrementing a counter in response to assertion of the feedback signal and resetting the counter in response to de-assertion of the feedback signal.

20. The method of claim 19, wherein filtering the feedback signal further comprises asserting the filtered feedback signal when the counter reaches a threshold level.

21. The method of claim 18, further comprising, if the filtered feedback signal is asserted, maintaining assertion of the filtered feedback signal until the input audio signal is modified in response to the filtered feedback signal.

22. The method of claim 12, wherein the clipping condition comprises simple clipping of the audio signal.

23. A system comprising:
a noise shaper configured to receive an input audio signal including a plurality of samples and perform a noise shaping process including re-quantizing the input audio signal to produce a processed audio signal and shifting quantization noise in the processed audio signal out of an audio band;

a detector configured to detect limiting of the input audio signal by the noise shaper to a minimum or a maximum value when a value of a sample of the input audio signal is outside a range specified by the minimum and maximum values, and not detect limiting of the input audio signal to the minimum or the maximum value when a value of a sample of the input audio signal is within the range specified by the minimum and maximum values; and a signal processor configured to receive a feedback signal indicative of whether limiting of the input audio signal to the minimum or maximum value is detected by the detector;

wherein the signal processor is configured to modify the input audio signal in response to the feedback signal received from the detector.

24. The system of claim 23, wherein the signal processor is configured to modify the input audio signal as a function of the detected limiting to the minimum or maximum value.

25. The system of claim 24, further comprising a filter configured to filter the feedback signal prior to the signal processor receiving the feedback signal.

26. The system of claim 23, wherein the signal processor is configured to modify the input audio signal by limiting one or more values of samples of the input audio signal to the maximum or minimum value prior to re-quantizing of the one or more values of samples of the input audio signal.

27. A method for use in a digital audio amplifier, the method comprising:
receiving an input audio signal including a plurality of samples;

performing a noise shaping process including re-quantizing by a quantizer the input audio signal to produce a processed audio signal and shifting quantization noise in the processed audio signal out of an audio band;

detecting limiting of the input audio signal by the noise shaping process to a minimum or a maximum value when a value of a sample of the input audio signal is outside a range specified by the minimum and maximum values, and not detecting limiting of the input audio signal to the minimum or the maximum value when a value of a sample of the input audio signal is within the range specified by the minimum and maximum values; and modifying the input audio signal in response to detecting the limiting of the input audio signal.

28. The method of claim 27, wherein modifying of the input audio signal is a function of the detected limiting of the input audio signal by the noise shaping process.

29. The method of claim 27, wherein modifying the input audio signal comprises limiting one or more values of samples of the input audio signal to the maximum or minimum value prior to re-quantizing of the one or more values of samples of the input audio signal.

* * * * *

UNITED STATES PATENT AND TRADEMARK OFFICE
CERTIFICATE OF CORRECTION

| | | |
|---|---|---|
| PATENT NO. | : 7,590,251 B2 | Page 1 of 1 |
| APPLICATION NO. | : 10/805588 | |
| DATED | : September 15, 2009 | |
| INVENTOR(S) | : Andersen et al. | |

It is certified that error appears in the above-identified patent and that said Letters Patent is hereby corrected as shown below:

In claim 4, at column 12, line 24, after "by" delete "in".

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,590,251 B2  Page 1 of 1
APPLICATION NO. : 10/805588
DATED : September 15, 2009
INVENTOR(S) : Andersen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 958 days.

Signed and Sealed this

Twenty-first Day of September, 2010

David J. Kappos
*Director of the United States Patent and Trademark Office*